(12) United States Patent
Yin et al.

(10) Patent No.: US 12,514,099 B2
(45) Date of Patent: Dec. 30, 2025

(54) DISPLAY PANEL AND DISPLAY DEVICE

(71) Applicant: Shenzhen China Star Optoelectronics Semiconductor Display Technology Co., Ltd., Guangdong (CN)

(72) Inventors: Zhiyuan Yin, Guangdong (CN); Jinchuan Li, Guangdong (CN); Ting Shi, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 558 days.

(21) Appl. No.: 17/976,818

(22) Filed: Oct. 30, 2022

(65) Prior Publication Data

US 2024/0114718 A1 Apr. 4, 2024

(30) Foreign Application Priority Data

Sep. 30, 2022 (CN) .......................... 202211215495.0

(51) Int. Cl.
*H10K 59/80* (2023.01)
*H10K 59/122* (2023.01)
(Continued)

(52) U.S. Cl.
CPC ......... *H10K 59/879* (2023.02); *H10K 59/122* (2023.02); *H10K 59/173* (2023.02); *H10K 2102/331* (2023.02)

(58) Field of Classification Search
CPC .. H10K 50/858; H10K 59/122; H10K 59/173; H10K 2102/331; H10K 59/873; H10K 59/373
See application file for complete search history.

(56) References Cited

U.S. PATENT DOCUMENTS 8,872,207 B2 10/2014 Jeong et al.
10,439,167 B2 10/2019 Jo
(Continued)

FOREIGN PATENT DOCUMENTS

CN   103187536   7/2013
CN   106992199   7/2017
(Continued)

OTHER PUBLICATIONS

Notification of Office Action and Search Report Dated Jul. 17, 2025 From the State Intellectual Property Office of the People's Republic of China Re. Application No. 202211215495.0 and Its Translation Into English. (16 Pages).

*Primary Examiner* — Samuel A Gebremariam

(57) ABSTRACT

A display panel and a display device are provided. The display panel includes a first optical refraction layer and a second optical refraction layer. The first optical refraction layer includes a plurality of openings. The second refraction layer is filled in the plurality of openings. A refractive index of the second optical refraction layer is greater than a refractive index of the first optical refraction layer. Furthermore, nanoparticles are further disposed in the second optical refraction layer. When light passes through, the first optical refraction layer and the second optical refraction layer can effectively improve transmittance rates of the light. Meanwhile, the nanoparticles can further act on the light, thereby effectively increasing a light extraction rate of the display panel and improving display effect of the display panel.

14 Claims, 3 Drawing Sheets

(51) Int. Cl.
  *H10K 59/173*   (2023.01)
  *H10K 102/00*   (2023.01)

(56) References Cited

U.S. PATENT DOCUMENTS

| | | | |
|---|---|---|---|
| 11,605,802 B2 | 3/2023 | Kim et al. | |
| 2021/0005845 A1* | 1/2021 | Kim | G06F 3/0412 |
| 2021/0341649 A1* | 11/2021 | Lim | G02B 1/11 |

FOREIGN PATENT DOCUMENTS

| | | |
|---|---|---|
| CN | 113889513 | 1/2022 |
| JP | 2019-144363 | 8/2019 |

\* cited by examiner

DISPLAY PANEL AND DISPLAY DEVICE

RELATED APPLICATION

This application claims the benefit of priority of Chinese Patent Application No. 202211215495.0 filed on Sep. 30, 2022, the contents of which are incorporated by reference as if fully set forth herein in their entirety.

FIELD AND BACKGROUND OF THE INVENTION

The present invention relates to a field of design and manufacture of display panels, and particularly to a display panel and a display device.

With development of display technology, consumers have increasingly higher requirements for audio and video products. For manufacturers of display devices, production of display devices of high-resolution, high-quality is a development direction. As organic light emitting diodes (OLEDs) have characteristics such as self-illumination, high brightness, wide viewing angle, fast response, and full color components of red, green, and blue (RGB) being able to be manufactured, they are widely used in the display devices.

Illustrated in FIG. 1 is a schematic diagram of a film-layer structure of a display panel provided in the prior art. Specifically, the display panel includes an array substrate 101, an organic light-emitting layer 102, an encapsulation layer 103, a light enhancement layer 104, a polarizer 105 and a cover plate 106. Regarding the display panel, after the organic light-emitting layer 102 emits light, the light will pass through different film layers sequentially. When the light propagates in each film layer, a certain degree of loss will occur. Only about 20% of the light finally emitted from the panel. In order to improve the light extraction rate of the device, the light enhancement layer 104 is usually disposed, and the light extraction rate is increased through the light enhancement layer 104. However, in the prior art, when the aforesaid light enhancement layer is disposed, the enhancement effect of the light enhancement layer is unsatisfactory. The light extraction rate of the emission light cannot be guaranteed to be maximum, which cannot meet high-performance display requirements of display panels, and is not conducive to further improve display effect of the display panels.

In summary, when the display panels manufactured and obtained in the prior art display, the effect of the light enhancement layer in the panels is not obvious. The corresponding light extraction rate of the display panel is low, which cannot meet the high-performance display requirements of the display panels, and is not conducive to further improve of the display performance of the display panels.

SUMMARY OF THE INVENTION

Embodiments of the present invention provide a display panel and a display device, so that the problem of a low light extraction rate of light and unsatisfactory display effect incurred by effect of a light enhancement layer in current display panel being poor is cased.

In order to solve the aforesaid technical problem, the present invention provides a display panel, which includes:
- a substrate;
- a light-emitting layer, wherein the light-emitting layer is disposed on the substrate;
- an encapsulation layer, wherein the encapsulation layer is disposed on the light-emitting layer;
- a first optical refraction layer, wherein the first optical refraction layer is disposed on a side of light emission of the encapsulation layer, and the first optical refraction layer includes a plurality of openings;
- a second optical refraction layer, wherein the second optical refraction layer is disposed on a side away from light emission of the first optical refraction layer, and the second optical refraction layer is filled in the plurality of openings; and
- nanoparticles,
  wherein the nanoparticles are disposed in the second optical refraction layer, and a light refractive index corresponding to the first optical refraction layer is less than a light refractive index corresponding to the second optical refraction layer.

According to one embodiment of the present invention, the nanoparticles are metal nanoparticles, and the metal nanoparticles include any one of gold or silver.

According to one embodiment of the present invention, the second optical refraction layer includes a fill portion and a cover portion connected to the fill portion; and
  wherein the fill portion is filled in the plurality of openings, and the cover portion is disposed on the first optical refraction layer.

According to one embodiment of the present invention, the nanoparticles are disposed in the fill portion and the cover portion; and
  wherein a density of the nanoparticles disposed in the fill portion is greater than a density of the nanoparticles disposed in the cover portion.

According to one embodiment of the present invention, a particle size of the nanoparticles in the fill portion is less than a particle size of the nanoparticles in the cover portion.

According to one embodiment of the present invention, the nanoparticles are disposed in the cover portion and a region corresponding to the plurality of openings;
  wherein an area of a distribution region corresponding to the nanoparticles is greater than an opening area of the plurality of openings.

According to one embodiment of the present invention, the nanoparticles are disposed in different layers in a thickness direction of the cover portion; and
  wherein a distribution density of the nanoparticles at a side close to the first optical refraction layer is greater than a distribution density of the nanoparticles at a side away from the first optical refraction layer.

According to one embodiment of the present invention, the light refractive index of the first optical refraction layer is configured to range from 1.5 to 1.6, and the light refractive index of the second optical refraction layer is configured to range from 1.6 to 2.0.

According to one embodiment of the present invention, a cross section of the second optical refraction layer is configured to be any one of a trapezoid, an arc, or a triangle at a region of the plurality of openings.

According to a second aspect of embodiments of the present invention, a display device is further provided. The display device includes the display panel provided in the embodiments of the present invention.

Beneficial effects of the embodiments of the present invention: Corresponding to the prior art, embodiments of the present invention provide a display panel and a display device. The display panel includes a first optical refraction layer and a second optical refraction layer. Wherein, the second optical refraction layer is disposed on the first optical refraction layer, openings are defined in the first optical refraction layer, and a refractive index of the second optical refraction layer is greater than a refractive index of the first optical refraction layer. Meanwhile, nanoparticles are further disposed in the display panel, and the nanoparticles are disposed in the second optical refraction layer. When light passes through the aforesaid film layers, the first optical refraction layer and the second optical refraction layer act on the light. Meanwhile, nanoparticles can provide a plasmon effect, so that light transmission through the film layers is further improved. In embodiments of the present application, by two optical refraction layers with different refractive indices of light and the nanoparticles, the light extraction rate of the display panel and the display device is effectively increased, and the display effect of the display panel is improved.

BRIEF DESCRIPTION OF THE SEVERAL VIEWS OF THE DRAWINGS

To more clearly illustrate embodiments or the technical solutions, the accompanying figures required for illustrating embodiments or the technical solutions of the present application will be described in brief. Obviously, the accompanying figures described below are only part of the embodiments of the present application, from which figures those skilled in the art can derive further figures without making any inventive efforts.

DESCRIPTION OF SPECIFIC EMBODIMENTS OF THE INVENTION

The following disclosure provides different embodiments or examples to realize different structures of the present invention with reference to the accompanying drawings in the embodiments of the present invention. In order to simplify the present invention, the components and configurations of the specific examples are described below. Moreover, the present invention provides examples of various specific processes and materials, which can be recognized the use of other processes by ordinary skill in the art. All other embodiments obtained by those skilled in the art based on the embodiments without creative efforts are within the scope of the present invention.

In the description of the present invention, it should be understood that the orientation or positional relationship indicated by the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise" etc. is based on the orientation or positional relationship shown in the accompanying figures, which is merely for the convenience for describing of the present invention and for the simplification of the description, and is not intended to indicate or imply that the indicated devices or elements have a specific orientation or is constructed and operated in a specific orientation. Therefore, it should not be understood as a limitation on the present invention. Moreover, the terms "first" and "second" are used for descriptive purposes only and are not to be understood as indicating or implying relative importance or implicitly indicating the number of the indicated technical characteristics.

Because in the prior art, when light passes through the aforesaid film layers, different extents of loss can occur, and the light extraction rate of the light finally passing through each film layer to the environment is only about 20%. Furthermore, when a light enhancement layer enhances the light, the enhancement effect is unsatisfactory, which cannot make the light extraction rate be maximum, thereby being not to further improve display effect of the display panel.

Embodiments of the present application provide a display panel and a display device. By improving the film-layer structure in the display panel, the light extraction rate of the light is effectively increased, and the display effect is improved.

Figure 1:
FIG. 1 is a schematic diagram of a film-layer structure of a display panel provided in the prior art.
Figure 2:
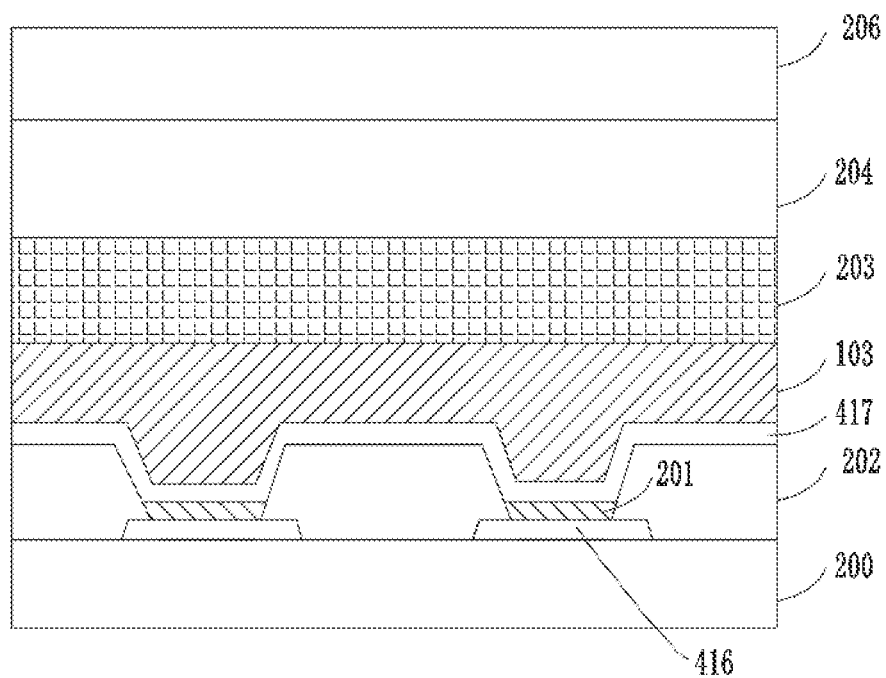
FIG. 2 is a schematic diagram of a film-layer structure of a display panel provided by one embodiment of the present application.

Illustrated in FIG. 2 is a structural schematic diagram of film layers of a display panel provided by one embodiment of the present application. Specifically, the display panel includes: an array substrate 200, an anode 416, a light-emitting layer 201, a pixel definition layer 202, a cathode 417, an encapsulation layer 103, an optical refraction layer 203, a passivation layer 204, and a protection layer 206.

Specifically, the array substrate 200 includes a substrate, and the substrate can be a flexible substrate, e.g., a flexible substrate of polyimide, etc. Meanwhile, the anode 416 is disposed on the array substrate 200, the light-emitting layer 201 is disposed at a position corresponding to the anode 416, the pixel definition layer 202 is disposed on the array substrate 200, and the cathode 417 is disposed on the pixel definition layer 202 and covers the pixel definition layer 202. Meanwhile, the encapsulation layer 103 is disposed on the cathode 417, the optical refraction layer 203 is disposed on the encapsulation layer 103, the passivation layer 204 is disposed on the optical refraction layer 203, and the protection layer 206 is disposed on the passivation layer 204, thereby protecting the display panel through the protection layer 206. In one embodiment of the present application, when each of the aforesaid film layers is disposed, a polarizer can further be disposed between the passivation layer 204 and the protection layer 206 to realize different display requirements.

In one embodiment of the present application, when each of the aforesaid film-layer structures is disposed, the array substrate 200 can be a thin-film transistor array substrate. The light-emitting layer 201 is electrically connected to the thin-film transistor array substrate through the anode 416, so as to provide a control signal to the light-emitting layer 201 and to ensure that the light-emitting layer 201 emits light normally.

In one embodiment of the present application, by disposing the optical refraction layer 203 in the display panel, the light extraction rate of the light is effectively increased. Specifically, the optical refraction layer 203 includes two optical refraction layers with different refractive indices and structures. Furthermore, nanoparticles are disposed in the optical refraction layer. When the light passes through the aforesaid optical refraction layer 203, different optical refraction layers can together act on the light. Meanwhile, the nanoparticles can further enhance the light in the film layers, so as to effectively increase light extraction rate of the light.

Figure 3:
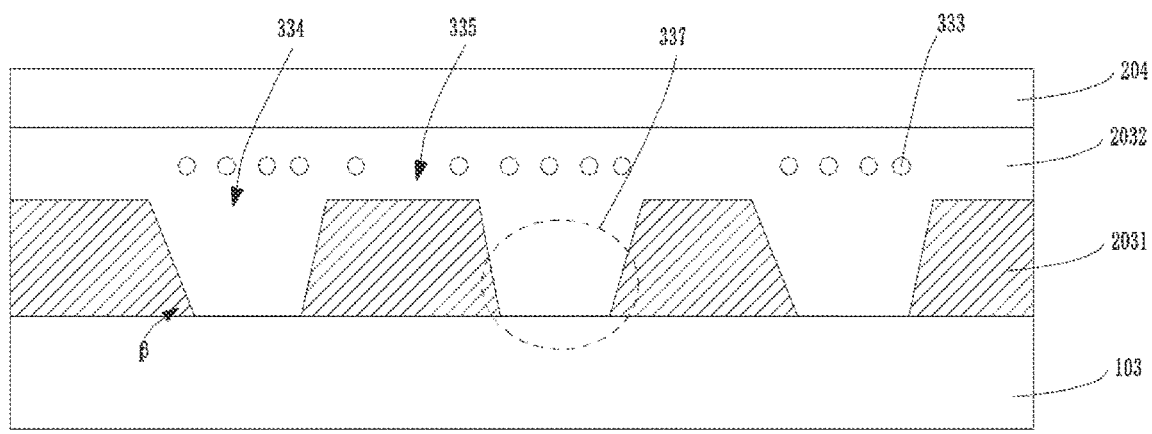
FIG. 3 is a schematic diagram of a part of film layers of the display panel provided by one embodiment of the present application.

Specifically, illustrated in FIG. 3 is a schematic diagram of a part of the film layers of the display panel provided by one embodiment of the present application. Specifically, in one embodiment of the present application, the optical refraction layer 203 includes a first optical refraction layer 2031 and a second optical refraction layer 2032.

Specifically, the first optical refraction layer 2031 is disposed on the encapsulation layer 103, the second optical refraction layer 2032 is disposed on the first optical refraction layer 2031 and completely covers the first optical refraction layer 2031, and the passivation layer 204 is disposed on the second optical refraction layer 2032. In one embodiment of the present application, the aforesaid encapsulation layer 103 can also be replaced with another film layer, e.g., replacing with a planarization layer or another passivation layer structure. The optical refraction layer is supported by the encapsulation layer 103, and the light is enhanced by the optical refraction layers.

Specifically, when the first optical refraction layer is disposed, the first refraction layer 2031 further includes a plurality of openings 334. The plurality of openings 334 are patterned and defined in the first optical refraction layer 2031. Specifically, during configuration, each opening 334 can be defined corresponding to each pixel unit of the display panel. In this way, the light emitted by light-emitting pixels in the pixel unit can pass through the openings 334, and can penetrate to be out of the display panel.

In one embodiment of the present application, when the aforesaid patterned opening 334 is defined, the opening 334 can be defined according to requirements of products. Specifically, different depths of the openings 334 can be configured. For example, the opening depth of each opening 334 can be same as the thickness of the first optical refraction layer 2031; or when the aforesaid openings 334 are defined, the depth of the openings 334 can be half of the thickness of the first optical refraction layer, so as to satisfy different requirements of the display panel.

Specifically, when the openings 334 are defined in the first optical refraction layer 2031, a shape of the openings 334 can be configured to be various shapes. Preferably, a shape of a cross section corresponding to the openings 334 can be configured to be a trapezoid, an arc, a triangle or other shaped structure, and redundant description will not be mentioned herein again. In the following embodiments, the cross-sectional shape of the openings 334 is taken as an example for description.

Preferably, the cross-sectional shape of the openings 334 is a trapezoid. An included angle β is formed between a bottom of the opening 334 and a surface of the substrate 301. The included angle β is an inclination angle of a lateral wall of the first optical refraction layer 2031 in the region corresponding to the opening 334. In one embodiment of the present application, in order to ensure the lateral wall can serve a relatively good effect on the light, the inclination angle can be configured to range from 20° to 80°. Preferably, in one embodiment of the present application, the inclination angle can be configured to be 80°, or configured to be 60°, 50°, 40°, or 30° according to requirements, thereby satisfying different usage requirements of the display panel. Meanwhile, the second optical refraction layer 2032 is filled in the openings 334. In this way, at the position corresponding to each opening 334, the cross-sectional shape of the second optical refraction layer 2032 is a trapezoidal structure 337. The trapezoidal structure 337 is similar to a micro-lens structure. When light passes through the micro-lens structure, the light can be enhanced by the micro-lens structure, thereby improving the light emission effect of the display panel.

In one embodiment of the present application, non-opening regions 335 correspond to a side of the openings 334. A cross-sectional shape of the first optical refraction layer 2031 corresponding to the plurality of non-opening regions 335 is also a trapezoid, and the lateral wall of the first optical refraction layer 2031 corresponding to the non-opening regions 335 forms peripheral lateral walls of each opening 334.

Figure 4:
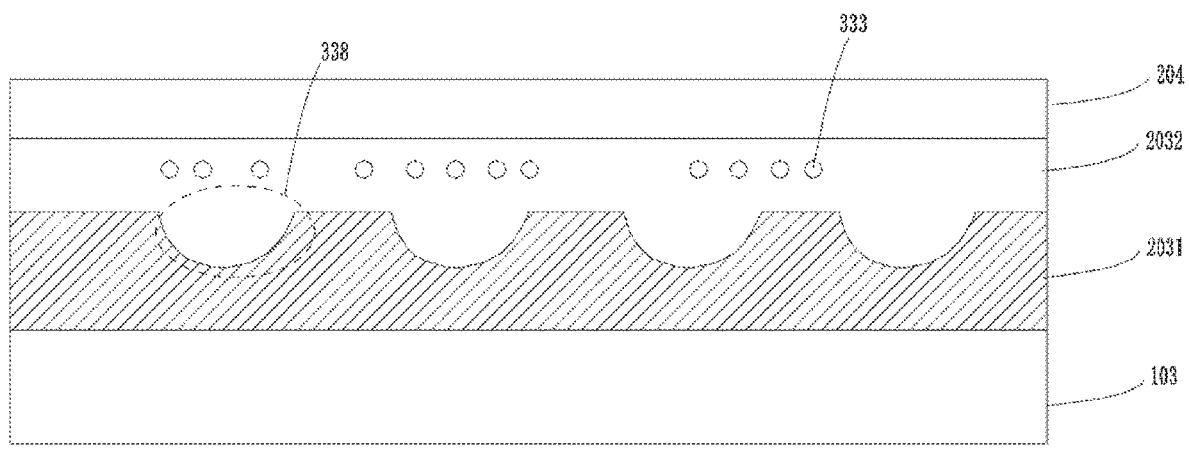
FIG. 4 is another structural schematic diagram of optical refraction layers provided by one embodiment of the present application.

Furthermore, illustrated in FIG. 4 is another structural schematic diagram of optical refraction layers provided by one embodiment of the present application. In one embodiment of the present application, when the first optical refraction layer 2031 is disposed, the cross-sectional shape of the patterned openings in the first optical refraction layer 2031 is an arc-shaped cross-section. Regarding FIG. 4, the first optical refraction layer 2031 corresponding to the arc-shaped section is a convex lens structure 338. The light is enhanced through the convex lens structure 338, or the arc-shaped opening is configured into a hemispherical structure according to requirements. When the light passes through the film layers in the region corresponding to the openings, the openings can further act on the light and can effectively improve the light extraction rate of the light.

Furthermore, as illustrated in FIG. 3, the second optical refraction layer 2032 is filled in the openings 334 and completely covers the first optical refraction layer 2031.

Meanwhile, in one embodiment of the present application, the display panel further includes nanoparticles 333. The nanoparticles 333 are disposed in the second optical refraction layer 2032.

In one embodiment of the present application, the nanoparticles 333 are metal nanoparticles. Preferably, the metal nanoparticles can be gold nanoparticles, silver nanoparticles or metal nanoparticles of other materials, or other materials that can form a plasmon effect on a surface. The metal nanoparticles have well localized surface plasmon effect. When the light is irradiated on the metal nanoparticles, the plasmon effect can cause the light to have a resonance effect in the local region of the nanoparticles, thereby enhancing propagation effect of the light in the film layers. Furthermore, when the nanoparticles 333 are manufactured, they can be configured according to requirements of actual products, and redundant description will not be mentioned herein again.

In one embodiment of the present application, when the nanoparticles 333 are disposed in the second optical refraction layer 2032, the nanoparticles 333 can be uniformly distributed in the second optical refraction layer 2032; or according to requirements of products, different distribution densities can be configured in different regions, and in a same region, corresponding distribution densities are same.

Figure 5:
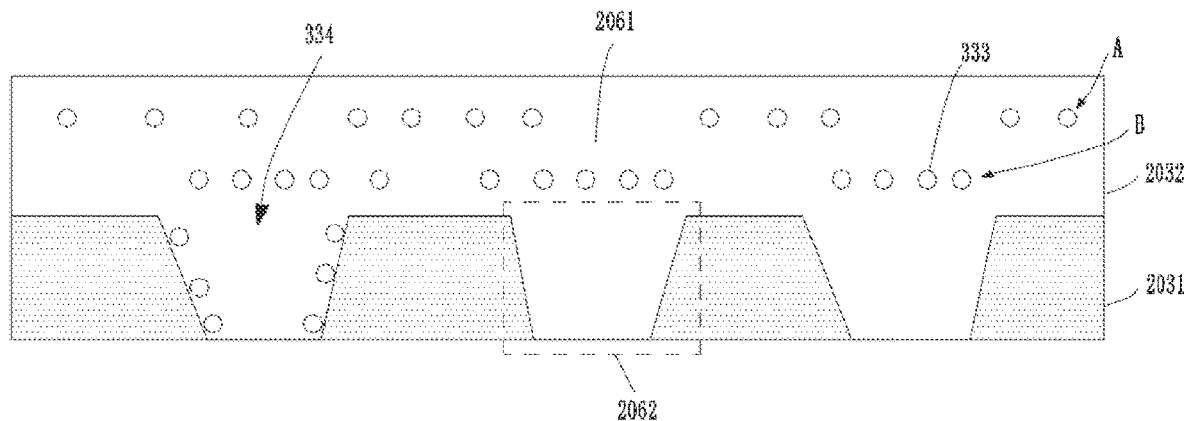
FIG. 5 is still another schematic diagram of the film-layer structure corresponding to the optical refraction layers provided by one embodiment of the present application.

Illustrated in FIG. 5 is still another schematic diagram of the film-layer structure corresponding to the optical refraction layers provided by one embodiment of the present application. When the aforesaid optical refraction layers and the nanoparticles are disposed, a particle size of the nanoparticles is configured to range from 25 nm to 125 nm. Preferably, the particle size of the nanoparticles is configured to range from 20 nm to 80 nm, e.g., the particle size of the nanoparticles is configured to be 70 nm, 50 nm, or 60 nm, thereby being adaptive in different display panels, and ensuring relatively good effect on the light.

Furthermore, regarding FIG. 5, when the second optical refraction layer 2032 is disposed, the second optical refraction layer 2032 further includes a fill portion 2062 and a cover portion 2061. Wherein, the fill portion 2062 is disposed under the cover portion 2061, is connected to the cover portion 2061, and forms the entire second optical refraction layer 2032.

Wherein, the fill portion 2062 is disposed in the openings 334 correspondingly, and completely fills the openings 334.

When the aforesaid nanoparticles 333 are disposed in the second optical refraction layer 2032, the nanoparticles 333 can be correspondingly disposed in the aforesaid fill portion 2062 and the cover portion 2061. Furthermore, when the nanoparticles 333 are disposed in the fill portion 2062, the nanoparticles 333 can be disposed in regions of lateral walls corresponding to the openings 334. When light enters the second optical refraction layer 2032 from the bottom, an effect can firstly occur at the lateral wall of the opening 334, thereby effectively improving the effect of the nanoparticles 333 acting on the light.

Regarding FIG. 3, in one embodiment of the present application, when the nanoparticles 333 are disposed, the nanoparticles 333 can only disposed in the cover portion 2061 of the second optical refraction layer 2032. Preferably, the nanoparticles are equally spaced in the cover portion 2061. Furthermore, when the aforesaid nanoparticles 333 are disposed, the distance between two adjacent nanoparticles can also be adjusted according to light emission effect of actual products. For example, changing a spacing value between two adjacent nanoparticles to make the formed display panel meet requirements and ensure the display effect of the display panel.

Preferably, the distance between two adjacent nanoparticles 333 is configured to range from 50 nm to 100 nm. Specifically, the distance between two adjacent nanoparticles 333 is configured to be 60 nm, thereby ensuring an arrangement density of the nanoparticles 333 in the second optical refraction layer 2032, and making the nanoparticles can serve the best effect on light.

Preferably, the nanoparticles 333 can be disposed in a middle region of the cover portion 2061 of the second optical refraction layer 2032, e.g., a layer of nanoparticles 333 can be disposed at a position of a half of the thickness of the cover portion 2061. When light acts on in the opening 334 and enters the second optical refraction layer 2032, effect can be served on the light by the nanoparticles 333 in the middle region, and the plasmon effect can be generated on the surface of the nanoparticles 333, thereby improving the propagation effect of light in the refraction layer. Therefore, the light extraction rate of light is increased.

In one embodiment of the present application, the nanoparticles 333 can further be disposed in different regions. Regarding FIG. 5, in one embodiment of the present application, when the nanoparticles 333 are disposed, the nanoparticles 333 are respectively disposed in the cover portion 2061 and the fill portion 2062 of the second optical refraction layer 2032. In this way, the light propagated from the opening 334 can be acted on by the nanoparticles 333 for many times, thereby effectively improving the effect acted on the light.

Furthermore, during configuration, an orthogonal projection area formed from a distribution region of the nanoparticles 333 in the first optical refraction layer 2031 is greater than an orthogonal projection area formed from the openings 334 in the first optical refraction layer 2031. Therefore, the light in the region of the openings 334 can be acted on as much as possible by all the nanoparticles 333, thereby improving the propagation effect of the light.

In one embodiment of the present application, in order to ensure the effect of the second optical refraction layer 2032 acted on light. During configuration, the nanoparticles 333 in different regions can be made to have different effects acted on the light, so as to enhance the light as much as possible. Specifically, the particle size of the nanoparticles 333 in the fill portion 2062 can be made to be greater than the particle size of the nanoparticles 333 in the cover portion 2061. When the light propagates to the outside of the refraction layer, the light can pass through the opening 334 at first. Therefore, the light can be affected by the nanoparticles 333 in the fill portion 2062 in the region of the opening 334 at first. When the nanoparticles 333 in the region of the opening 334 are relatively large, the effect of the large-sized metal nanoparticles 333 acted on the light will be greater. Therefore, the plasmonic effect of light on the surface of the nanoparticles is improved.

Furthermore, when the corresponding nanoparticles 333 in the fill portion 2062 are disposed, the nanoparticles 333 can be disposed at a position close to the lateral wall of the opening 334. Specifically, the nanoparticles 333 can be disposed near an intersecting interface of the first optical refraction layer 2031 and the second optical refraction layer 2032. Furthermore, a distribution density of the corresponding nanoparticles 333 in the fill portion 2062 is greater than a distribution density of the corresponding nanoparticles 333 in the cover portion 2061.

Meanwhile, as the light is acted on by the fill portion 2062 at first, the particle size of the nanoparticles 333 in the fill portion 2062 can be made to be greater than the particle size of the nanoparticles 333 in the cover portion 2061. When the light enters the second optical refraction layer 2032 from the fill portion 2062, the good effect of the nanoparticles 333 acted on the light can be effectively improved, and the light extraction rate of the light is increased.

Regarding FIG. 5, in one embodiment of the present application, when the aforesaid nanoparticles 333 are disposed in the second optical refraction layer 2032, the nanoparticles 333 can also be disposed in different layers in the cover portion 2061, e.g., a first layer A and a second layer B. The first layer A is away from a side of light emission, e.g., the first layer A is away from a side of the openings 334. Meanwhile, the second layer B is close to a side of the light emission, e.g., the second layer B is close to the side of the openings 334.

Specifically, a distribution density of the nanoparticles 333 disposed at the first layer A is equal to a distribution density of the nanoparticles 333 disposed at the second layer B, or the distribution density of the nanoparticles 333 disposed at the first layer A is configured to be different from the distribution density of the nanoparticles 333 disposed at the second layer B according to requirements of products. Preferably, the distance between two adjacent nanoparticles 333 is configured to range from 50 nm to 100 nm.

Preferably, the distribution density of nanoparticles 333 in the second layer B is greater than the distribution density of nanoparticles 333 in the first layer A. In this way, when the light propagates in the second optical refraction layer 2032, the light can be acted on by the nanoparticles 333 in the second layer B at first, thereby increasing the light extraction rate of the light in the second optical refraction layer 2032. Therefore, the display effect of the display panel is improved.

Meanwhile, when the corresponding nanoparticles 333 in the first layer A and the second layer B are disposed, orthographic projections of the nanoparticles 333 in the first layer A and the second layer B at least partially overlap with the region of the openings 334. Therefore, all the nanoparticles in different regions being able to act on the light in the region of the openings 334 is ensured, so as to improve the effect acted on the light.

In one embodiment of the present application, the nanoparticles 333 in the cover portion 2061 can also be configured to be other number of layers according to requirements of actual products. By configuring different nanoparticles in different regions of the cover portion 2061, the effect on light can be improved to the greatest extent.

Specifically, in one embodiment of the present application, when the first optical refraction layer 2031 is disposed, the thickness of the first optical refraction layer 2031 is configured to range from 3 µm to 5 µm, and the thickness is same as the thickness of the fill portion 2062, so as to ensure that the first optical refraction layer 2031 has a relatively thin film thickness. Meanwhile, the effect of the fill portion 2062 is also ensured. Preferably, a thickness of the first optical refraction layer 2031 is configured to be 4 µm.

Furthermore, a total thickness of the second optical refraction layer 2032 is configured to range from 5 µm to 15 µm. Preferably, the thickness of the second optical refraction layer 2032 corresponding to the cover portion 2061 can be configured to range from 2 µm to 10 µm. Therefore, the cover portion 2061 having a good thickness is ensured, while effect acted on the light is also ensured, thereby effectively improving effect of the two refraction layers acted on the light.

Furthermore, an ink layer can be selected as a material of the second optical refraction layer 2032. During manufacture, a layer of ink is inkjet printed on the first optical refraction layer 2031. After the transparent ink is dried, the second optical refraction layer 2032 with a required structure is formed.

In one embodiment of the present application, the first optical refraction layer 2031 can be a photoresist material layer. By etching the photoresist material layer, finally, the first optical refraction layer 2031 of the patterned structure provided in the embodiments of the present application is formed.

Preferably, light transmittance rates corresponding to the first optical refraction layer 2031 and the second optical refraction layer 2032 are both greater than 90%. Therefore, optical loss of the light in the first optical refraction layer 2031 and the second optical refraction layer 2032 is effectively reduced, and the light extraction rate of the light is increased.

In one embodiment of the present application, when the aforesaid first optical refraction layer 2031 and second optical refraction layer 2032 are disposed, an optical refractive index corresponding to the first optical refraction layer 2031 is smaller than an optical refractive index corresponding to the second optical refraction layer 2032. That is, the refractive index corresponding to the first optical refraction layer 2031 is $n_1$, and the refractive index corresponding to the second optical refraction layer 2032 is $n_2$, and wherein $n_1 < n_2$.

In one embodiment of the present application, the first optical refraction layer 2031 is a low refraction layer, and the second optical refraction layer 2032 is a high refraction layer. Preferably, $n_1$ of the first optical refraction layer 2031 is configured to range from 1.5 to 1.6. Preferably, $n_1$ is configured to be 1.55. Meanwhile, $n_2$ of the second optical refraction layer 2032 is configured to range from 1.6 to 2.0. Preferably, $n_2$ is configured to be 1.75. In one embodiment of the present application, a difference between $n_2$ and $n_1$ can be greater than or equal to 0.2. At this time, $n_1 = 1.55$, and $n_2 = 1.75$. Therefore, when the two refraction layers interact with the light, the effect of the two different refraction layers acted on the light is ensured, and the light extraction rate is effectively increased.

Figure 6:
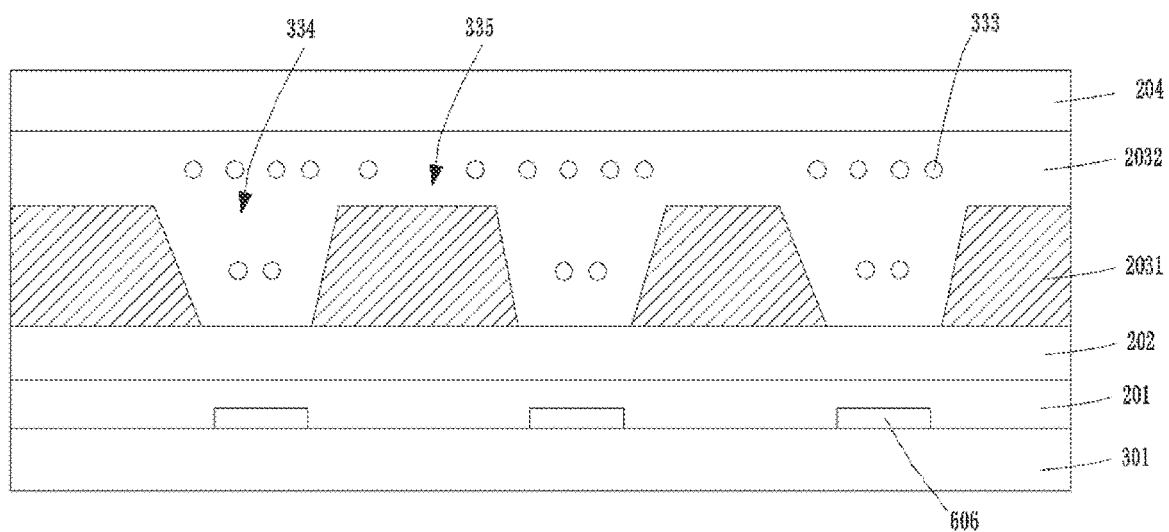
FIG. 6 is a schematic diagram of a film-layer structure of another display panel provided by one embodiment of the present application.

Furthermore, illustrated in FIG. 6 is a schematic diagram of a film-layer structure of another display panel provided by one embodiment of the present application. In one embodiment of the present application, the display panel further includes a substrate 301, a light-emitting layer 201 disposed on the substrate 301, a pixel definition layer 202 disposed on the light-emitting layer 201, and a first optical refraction layer 2031 disposed on the pixel definition layer 202. In one embodiment of the present application, when the light-emitting layer 201 and the aforesaid different optical refraction layers are disposed, the light-emitting layer 201 is correspondingly provided with a plurality of light-emitting units 606. Furthermore, the openings 334 in the first optical refraction layer 2031 are defined corresponding to the light-emitting units 606. When the light-emitting units 606 emit light, the light can be directly emitted from the corresponding opening 334, so as to ensure the effect of the aforesaid refraction layers acted on the light.

In one embodiment of the present application, an opening width corresponding to the openings 334 can be not smaller than a width of the corresponding light-emitting unit 606. In this way, the light emitted from the light-emitting unit 606 can be transmitted through the opening 334 to the greatest extent, thereby ensuring the light extraction rate of the light.

Furthermore, one embodiment of the present application further provides a display device. The display device includes the display panel provided in the embodiments of the present application. When the aforesaid display panel is disposed, a first optical refraction layer and a second optical refraction layer are disposed in the display panel. Furthermore, the first optical refraction layer is disposed on a side of light emission of the display panel. A plurality of patterned openings are defined in the first optical refraction layer. The second optical refraction layer is disposed on a side away from light emission, and the second optical refraction layer fills corresponding openings.

Meanwhile, a refractive index of the first optical refraction layer is less than a refractive index of the second optical refraction layer. Furthermore, nanoparticles are further disposed in the second optical refraction layer. The nanoparticles are metal nanoparticles. When light acts on the metal nanoparticles, a plasmon effect can be formed on the surface of the metal nanoparticles, thereby effectively increasing the light extraction rate of the light and ensuring the display effect of the display panel.

In one embodiment of the present application, the display panel and the corresponding display device can be any product or component with display function or touch function, such as a mobile phone, a computer, an electronic paper, a monitor, a notebook computer, a digital photo frame, etc., which specific types are not specifically limited.

In summary, detailed description of the display panel and the display device provided by embodiments of the present invention is described above. The principle and implementation manner of present invention are described herein with reference to specific embodiments. The foregoing descriptions of the embodiments are merely used for better understanding the technical solutions and core ideas of the present invention. Although the present invention has disclosed the preferred embodiments as above, however the aforesaid preferred embodiments do not intend to limit to the present disclosure. A person skilled in the art can make any change and modification, therefore the scope of protection of the present invention is subjected to the scope defined by the claims.

What is claimed is:

1. A display panel, comprising:
   a substrate;
   a light-emitting layer, wherein the light-emitting layer is disposed on the substrate;
   an encapsulation layer, wherein the encapsulation layer is disposed on the light-emitting layer;
   a first optical refraction layer, wherein the first optical refraction layer is disposed on a side of light emission of the encapsulation layer, and the first optical refraction layer comprises a plurality of openings;
   a second optical refraction layer, wherein the second optical refraction layer is disposed on a side away from light emission of the first optical refraction layer, and the second optical refraction layer is filled in the plurality of openings;
   nanoparticles,
   wherein the nanoparticles are disposed in the second optical refraction layer, and a light refractive index corresponding to the first optical refraction layer is less than a light refractive index corresponding to the second optical refraction layer, and wherein the second optical refraction layer comprises a fill portion and a cover portion connected to the fill portion: the fill portion is filled in the plurality of openings, and the cover portion is disposed on the first optical refraction layer, the nanoparticles are disposed in the cover portion and a region corresponding to the plurality of openings, and an orthogonal projection area formed from a distribution region of the nanoparticles on the first optical refraction layer is greater than an orthogonal projection area formed from the openings on the first optical refraction layer.

2. The display panel as claimed in claim 1, wherein the nanoparticles are metal nanoparticles, and the metal nanoparticles comprise any one of gold or silver.

3. The display panel as claimed in claim 1, wherein the nanoparticles are disposed in the fill portion and the cover portion; and
   wherein a density of the nanoparticles disposed in the fill portion is greater than a density of the nanoparticles disposed in the cover portion.

4. The display panel as claimed in claim 3, wherein a particle size of the nanoparticles in the fill portion is greater than a particle size of the nanoparticles in the cover portion.

5. The display panel as claimed in claim 1, wherein the nanoparticles are disposed in different positions in a thickness direction of the cover portion; and
   wherein a distribution density of the nanoparticles at a side close to the first optical refraction layer is greater than a distribution density of the nanoparticles at a side away from the first optical refraction layer.

6. The display panel as claimed in claim 1, wherein the light refractive index of the first optical refraction layer is configured to range from 1.5 to 1.6, and the light refractive index of the second optical refraction layer is configured to range from 1.6 to 2.0.

7. The display panel as claimed in claim 1, wherein a cross section of the second optical refraction layer is configured to be any one of a trapezoid, an arc, or a triangle at a region of the plurality of openings.

8. A display device comprising a display panel, the display panel comprising:
   a substrate;
   a light-emitting layer, wherein the light-emitting layer is disposed on the substrate;
   an encapsulation layer, wherein the encapsulation layer is disposed on the light-emitting layer;
   a first optical refraction layer, wherein the first optical refraction layer is disposed on a side of light emission of the encapsulation layer, and the first optical refraction layer comprises a plurality of openings;
   a second optical refraction layer, wherein the second optical refraction layer is disposed on a side away from light emission of the first optical refraction layer, and the second optical refraction layer is filled in the plurality of openings;
   nanoparticles,
   wherein the nanoparticles are disposed in the second optical refraction layer, and a light refractive index corresponding to the first optical refraction layer is less than a light refractive index corresponding to the second optical refraction layer, and
   wherein the second optical refraction layer comprises a fill portion and a cover portion connected to the fill portion; the fill portion is filled in the plurality of openings, and the cover portion is disposed on the first optical refraction layer, the nanoparticles are disposed in the cover portion and a region corresponding to the plurality of openings, and an orthogonal projection area formed from a distribution region of the nanoparticles on the first optical refraction layer is greater than an orthogonal projection area formed from the openings on the first optical refraction layer.

9. The display panel as claimed in claim 8, wherein the nanoparticles are metal nanoparticles, and the metal nanoparticles comprise any one of gold or silver.

10. The display panel as claimed in claim 8, wherein the nanoparticles are disposed in the fill portion and the cover portion; and
    wherein a density of the nanoparticles disposed in the fill portion is greater than a density of the nanoparticles disposed in the cover portion.

11. The display panel as claimed in claim 10, wherein a particle size of the nanoparticles in the fill portion is greater than a particle size of the nanoparticles in the cover portion.

12. The display panel as claimed in claim 8, wherein the nanoparticles are disposed in different positions in a thickness direction of the cover portion; and
    wherein a distribution density of the nanoparticles at a side close to the first optical refraction layer is greater than a distribution density of the nanoparticles at a side away from the first optical refraction layer.

13. The display panel as claimed in claim 8, wherein the light refractive index of the first optical refraction layer is configured to range from 1.5 to 1.6, and the light refractive index of the second optical refraction layer is configured to range from 1.6 to 2.0.

14. The display panel as claimed in claim 8, wherein a cross section of the second optical refraction layer is configured to be any one of a trapezoid, an arc, or a triangle at a region of the plurality of openings.

* * * * *